(12) United States Patent
Lin

(10) Patent No.: US 6,970,374 B2
(45) Date of Patent: Nov. 29, 2005

(54) LOW LEAKAGE CURRENT STATIC RANDOM ACCESS MEMORY

(75) Inventor: Shih-Chin Lin, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 53 days.

(21) Appl. No.: 10/708,328

(22) Filed: Feb. 24, 2004

(65) Prior Publication Data

US 2005/0185448 A1 Aug. 25, 2005

(51) Int. Cl.$^7$ ............................................. G11C 11/00
(52) U.S. Cl. .................. 365/154; 365/149; 365/189.09
(58) Field of Search ................. 365/154, 149, 365/189.09, 156

(56) References Cited

U.S. PATENT DOCUMENTS 5,325,325 A * 6/1994 Azuma ....................... 365/156
6,314,041 B1 11/2001 Frey

* cited by examiner

Primary Examiner—David Lam
(74) Attorney, Agent, or Firm—Winston Hsu

(57) ABSTRACT

A static random access memory (SRAM) has a plurality of SRAM cells, a first switch unit, a second switch unit, and a capacitor. During read/write operations of the SRAM cells, the first switch unit and the second switch unit are turned on so that two power terminals of the SRAM cells respectively electrically connect to $V_{DD}$ and $V_{SS}$ and that the capacitor electrically connects between $V_{DD}$ and $V_{SS}$. When the SRAM cells are not accessed, the first switch unit and the second switch unit are turned off and the capacitor keeps a voltage gap between the two power terminals of the SRAM cells greater than a predetermined value.

17 Claims, 9 Drawing Sheets

LOW LEAKAGE CURRENT STATIC RANDOM ACCESS MEMORY

BACKGROUND OF INVENTION

1. Field of the Invention

The present invention relates to a static random access memory (SRAM), and more particularly, to a low leakage current SRAM.

2. Description of the Prior Art

As semiconductor technology improves, the diameter of wafers have been increased from 8 inches to 12 inches, and the line widths of transistors have been decreased from 0.18 μm to 0.13 μm, or to 0.1 μm. However, while semiconductor technology improves, sub-threshold leakages and gate leakages of the transistors become more and more severe and influence the behaviors of electric devices more obviously. Therefore, with the reduction of the line width, the leakage currents can make operations of SRAM diverge from specifications.

Please refer to FIG. 1, which is a schematic diagram of an SRAM 1 of the prior art. The SRAM 1 has a plurality of SRAM cells 10, which are arranged as a matrix, for storing data. Each of the SRAM cells 10 connects to a corresponding pair of bit lines 18 and a corresponding word line 20, and is controlled by the word lines 20 and the pair of bit lines 18. The SRAM 1 further has a plurality of sense amplifiers 24, which connect to the SRAM cells 10 via the bit lines 18. When data stored in the SRAM cells 10 are read, the sense amplifiers 24 amplify the data signal received from the bit lines 18.

Please refer to FIG. 2, which is a circuit diagram of the SRAM cell 10 shown in FIG. 1. The SRAM cell 10 is a 6T SRAM cell that is commonly and widely used in SRAM. The SRAM cell 10 has six transistors 12–16 and two power terminals SAP and SAN, where the power terminal SAP is connected to $V_{DD}$ the power terminal SAN is connected to $V_{SS}$. The voltage level of $V_{DD}$ is usually positive, i.e. +1.5 volts, and voltage level of $V_{SS}$ is usually equal to zero volts. However, $V_{SS}$ may also be a negative voltage in specific applications. The two N-type metal-oxide-semiconductor (NMOS) transistors 12 of the SRAM cell 10 respectively connect to $V_{SS}$, and two nodes A and B. The two nodes A and B are connected to $V_{DD}$ the two P-type metal-oxide-semiconductor (PMOS) transistors 14. Moreover, node A is connected to the gates of the right NMOS transistor 12 and the right PMOS transistor 14, and node B is connected to the gates of the left NMOS transistor 12 and the left PMOS transistor 14.

A flip-flop configuration is composed of the two NMOS transistors 12 and the two PMOS transistors 14 of the SRAM cell 10 so that data can be stored. When node A is at a logic low state, i.e. the voltage level of node A is approximately equal to $V_{SS}$, the right PMOS transistor 14 is turned on and the right NMOS transistor 12 is turned off. When the right PMOS transistor 14 is turned on and the right NMOS transistor 12 is turned off, the voltage level of node B is at a logic high state, i.e. the voltage level of node B is pulled up to approximately $V_{DD}$. Moreover, when node B is at the logic high state, the left PMOS transistor 14 is turned off and the left NMOS transistor 12 is turned on. When the left PMOS transistor 14 is turned off and the left NMOS transistor 12 is turned on, the voltage level of node A is pulled down. In this manner, the SRAM cell 10 remains in a latched state.

The two nodes A and B are respectively connected to the pair of bit lines 18 via the two NMOS transistors 16. The gates of the NMOS transistors 16 are connected to a corresponding world line 20. The bit lines 18 and the world line 20 are used to control read/write operations of the SRAM cell 10. During a read operation of the SRAM cell 10, the two NMOS transistors 16 are turned on by the world line 20 so that the voltage level of one of the two bit lines 18 is pulled up and the voltage level of another bit line 18 is pulled down. For instance, if node A is at the logic low state and the voltage level of the world line 20 is pulled up, the two PMOS transistors 16 are turned on. Meanwhile, the voltage of the left bit line BL is pulled down, and the voltage of the right bit line BLb is pulled up.

However, when node A is at the logic high state and the voltage level of the world line 20 is pulled down to turn off the two NMOS transistors 16, a sub-threshold leakage flows from node A through the left NMOS 12 to $V_{SS}$. Please refer to FIG. 3, which shows the sub-threshold leakages 22 of the SRAM cell 10 when the SRAM cell 10 is not accessed. In this case, node A is at the logic high state and node B is at the logic low state. When the SRAM 10 is not accessed, i.e. in a standby state, the two NMOS transistors 16 are turned off, and the voltage levels of the two bit lines 18 connected with the drains of the NMOS transistors 16 are below $V_{DD}$. Because the voltage level of node A is less than both $V_{DD}$ and the voltage level of the left bit line 18, there are two sub-threshold leakages 22 respectively flowing through the left PMOS transistor 14 and the left NMOS transistor 16 to node A. Moreover, because the voltage level of node B is greater than both $V_{SS}$ and the voltage level of the right bit line 18, there are two other sub-threshold leakages 22 respectively flowing from node B to the right bit line 18 and the power terminal SAN of the SRAM cell 10. There are such sub-threshold leakages 22 when the SRAM cell 10 is at the standby state, so if the number of SRAM cells 10 of the SRAM 1 is large, the total leakage of the SRAM 1 will be great and the operations of the SRAM 1 may become abnormal.

SUMMARY OF INVENTION

It is therefore a primary object of the claimed invention to provide an SRAM having low operating leakage current.

According to the claimed invention, a static random access memory has a plurality of SRAM cells for storing data, at least a first switch unit, at least second switch unit, and at least capacitor. During read/write operations of the SRAM cells, the first switch unit and the second switch unit are turned on so that two power terminals of each SRAM cell are electrically connected to $V_{DD}$ and $V_{SS}$ respectively and that the capacitor is electrically connected between $V_{DD}$ $V_{SS}$. When the SRAM cells are not accessed, the first switch unit and the second switch unit are turned off so that the two power terminals of each SRAM cell electrically disconnected from $V_{DD}$ $V_{SS}$, and the capacitor maintains a voltage gap between the two power terminals greater than a predetermined voltage value.

In an embodiment of the present invention, a static random access memory has at least a first wire, at least a second wire, a plurality of word lines, a plurality of pairs of bit lines, a plurality of SRAM cells for storing data, a first bias terminal for inputting $V_{DD}$, a second bias terminal for inputting $V_{SS}$, at least a first capacitor connected to the first wire for maintaining a voltage level of the first wire above a first predetermined voltage level, at least a second capacitor connected to the second wire for maintaining a voltage level of the second wire below a second predetermined voltage level, at least a first switch unit connected between the first bias terminal and the first wire having a first control terminal for inputting a first control signal, and at least a second switch unit connected between the second bias terminal and the second wire having a second control terminal for inputting a second control signal. Each of the SRAM cells is connected to the first wire, the second wire, a corresponding word line, and a corresponding pair of the bit lines. During read/write access of the SRAM cells, the first switch unit is turned on by the first control signal, and the second switch unit is turned on by the second control signal.

In an embodiment of the present invention, a static random access memory has a first bias terminal for inputting $V_{DD}$, a second bias terminal for inputting $V_{SS}$, a plurality of word lines, a plurality of pairs of bit lines, and a plurality of SRAM rows. Each of the SRAM rows has a first wire, a second wire, a plurality of SRAM cells for storing data, a first capacitor connected to the first wire for maintaining a voltage level of the first wire above a first predetermined voltage level, a second capacitor connected to the second wire for maintaining a voltage level of the second wire below a second predetermined voltage level, a first switch unit connected between the first bias terminal and the first wire having a first control terminal for inputting a corresponding first control signal, and a second switch unit connected between the second bias terminal and the second wire having a second control terminal for inputting a corresponding second control signal. Each of the SRAM cells is connected to the first wire, the second wire, a corresponding word line, and a corresponding pair of the bit lines. During read/write operations of the SRAM cells of one of the SRAM rows, the first switch unit of the SRAM row is turned on by the first control signal, and the second switch unit of the SRAM row is turned on by the second control signal.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
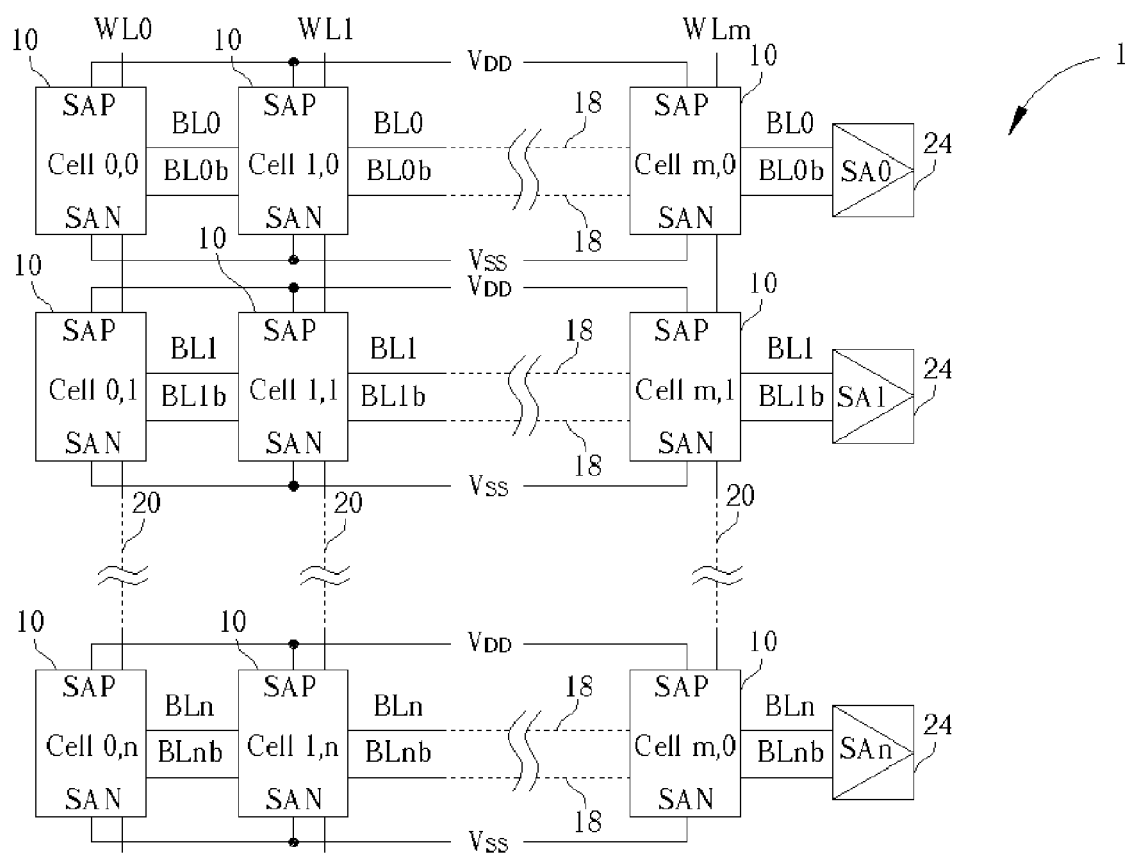
FIG. 1 is a schematic diagram of an SRAM of the prior art.
Figure 2:
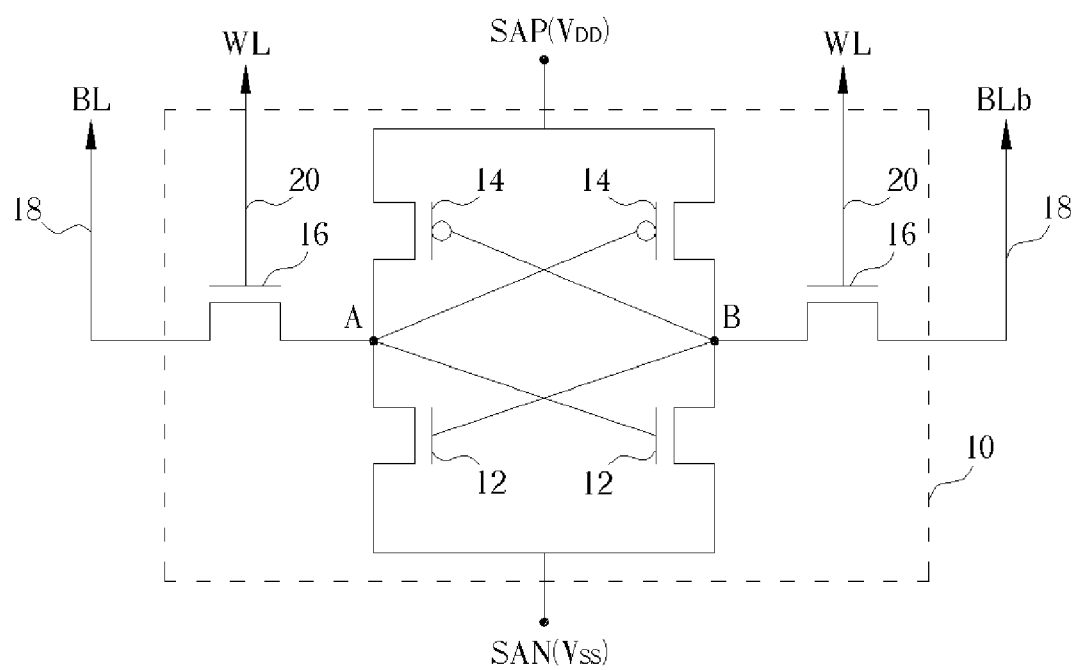
FIG. 2 is a circuit diagram of the SRAM cell shown in FIG. 1.
Figure 3:
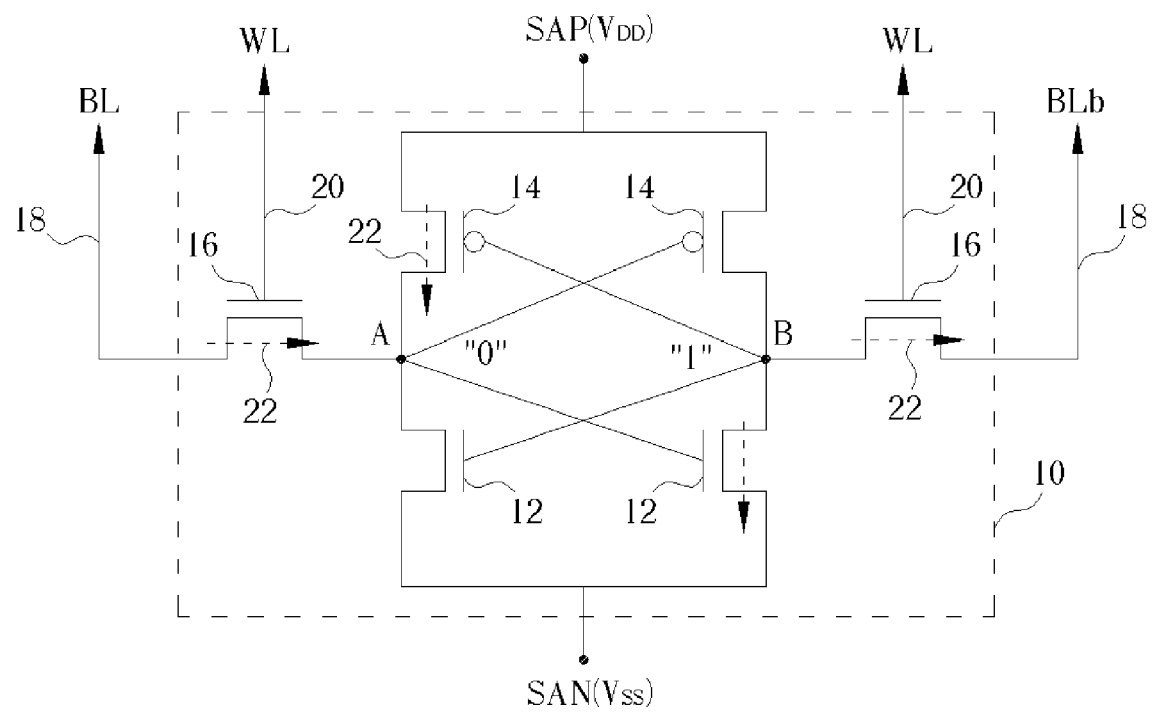
FIG. 3 shows the sub-threshold leakages of the SRAM cell shown in FIG. 2 when it is not accessed.
Figure 4:
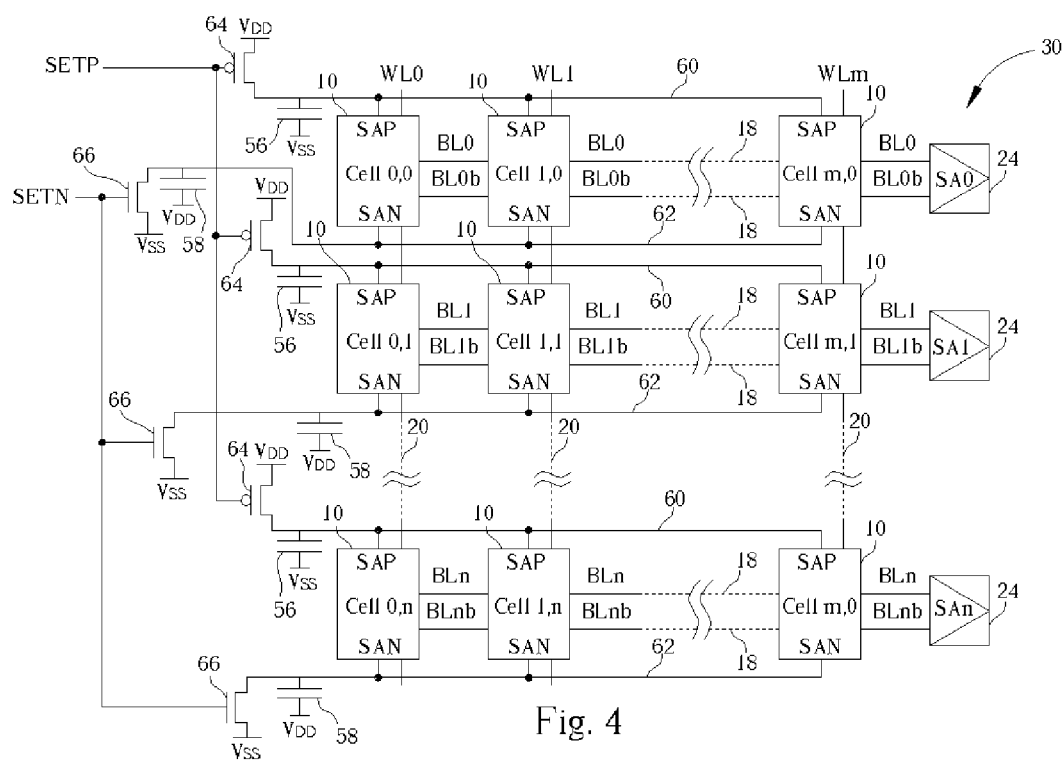
FIG. 4 is a schematic diagram of a static random access memory in accordance with one preferred embodiment of the present invention.

Please refer to FIG. 4, which is a schematic diagram of a static random access memory 30 in accordance with one preferred embodiment of the present invention. Similar to the SRAM 1 of the prior art, the SRAM 30 also has a plurality of SRAM cells 10, a plurality of bit lines 18, a plurality of word lines 20, and a plurality of sense amplifiers 24. The SRAM cells are arranged as a matrix and controlled by the bit lines 18 and the world lines 20. The sense amplifiers 24 are connected to the SRAM cells 10 via the bit lines 18. The read/write operations of the SRAM cells 10 are well known in the art and thus will not be repeated here.

A major difference between the SRAM 30 and the SRAM 1 is that the SRAM 30 further has a plurality of first capacitors 56, a plurality of second capacitors 58, a plurality of first switch units 64, and a plurality of second switch units 66. One of the two terminals of each first capacitor 56 is connected to a corresponding first switch unit 64 and the first power terminals SAP of the SRAM cells 10 at the same row via a first wire 60, and another terminal of the first capacitor 56 is connected to $V_{SS}$. One of the two terminals of each second capacitor 58 is connected to a corresponding second switch unit 66 and the second power terminals SAN of the SRAM cells 10 at the same row via a second wire 62, and another terminal of the second capacitor 58 is connected to $V_{DD}$. In this embodiment, each of the first switch units 64 is a PMOS transistor, having a source connected to $V_{DD}$, a drain used for receiving a first control signal SETP so as to turn on/off the first switch unit 64, the drain connected to a corresponding first capacitor 56 and the first power terminals SAP of the SRAM cells 10 at the same row. Each of the second switch units 66 is an NMOS transistor, having a source connected to $V_{SS}$, a drain used for receiving a second control signal SETN so as to turn on/off the second switch unit 66, the drain connected to a corresponding second capacitor 58 and the second power terminals SAN of the SRAM cells 10 at the same row.

Figure 5:
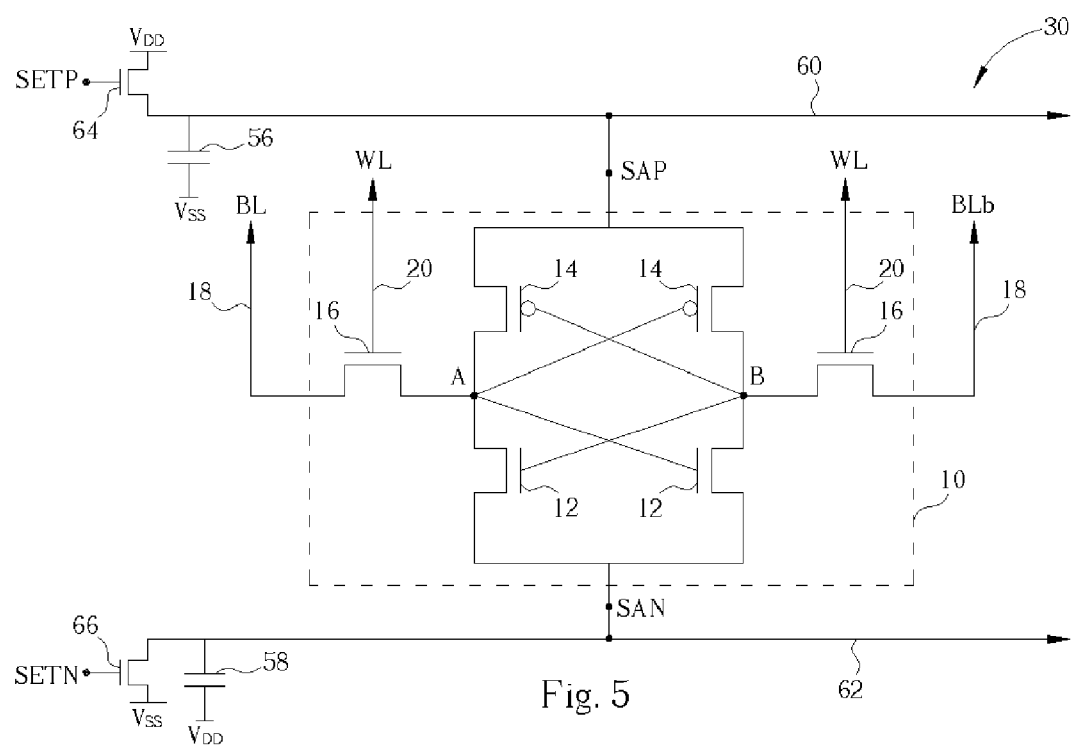
FIG. 5 is a circuit diagram of the SRAM shown in FIG. 4.
Figure 6:
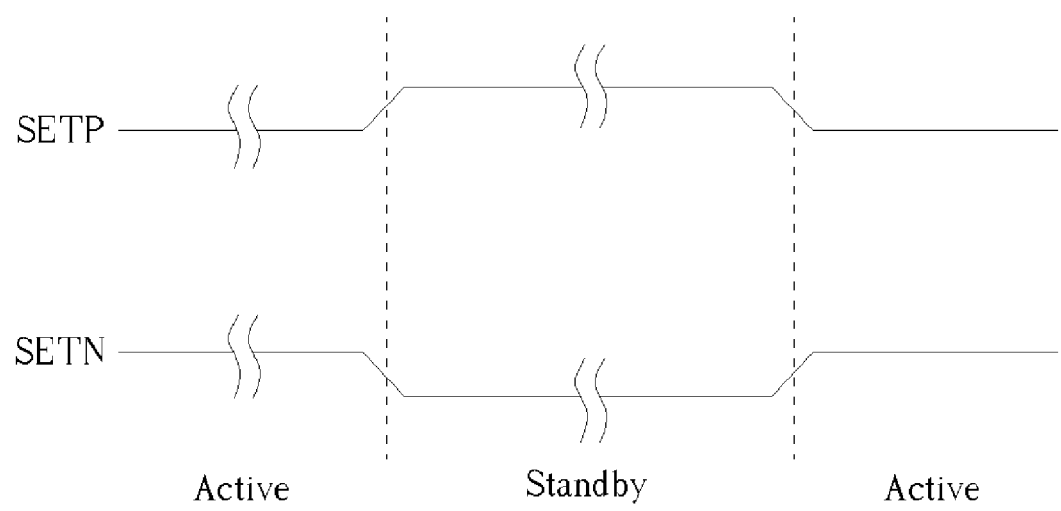
FIG. 6 is a timing diagram of a first control signal and a second control signal.

To describe how the SRAM 30 operates, please refer to FIGS. 5–6. FIG. 5 is a circuit diagram of the SRAM 30, and FIG. 6 is a timing diagram of the first control signal SETP and the second control signal SETN. When the SRAM 30 is accessed, the control signal SETP is pulled down to a low voltage level to turn on each of the first switch units 64, and the control signal SETN is pulled up to a high voltage level to turn on each of the second switch unit 66. Therefore, $V_{DD}$ is applied to the first power terminals SAP of the SRAM cells 10 via the first wires 60, and the first capacitor 56 are charged. Meanwhile, $V_{SS}$ is applied to the second power terminals SAN of the SRAM cells 10 via the Second wires 62, and the second capacitor 58 are charged. A voltage gap between the two power terminals of each SRAM cells 10, thus, is approximately equal to $V_{DD}-V_{SS}$ while the SRAM 30 is accessed. When the SRAM 30 is not accessed and is at a standby state, the control signal SETP is pulled up to the high voltage level to turn off the first switch units 64, and the control signal SETN is pulled down to the low voltage level to turn off the second switch unit 66. Therefore, $V_{DD}$ cannot be applied to the first power terminals SAP of the SRAM cells 10, and $V_{SS}$ cannot be applied to the second power terminals SAN of the SRAM cells 10. However, the first capacitors 56 and the second capacitors 58 are respectively charged by $V_{DD}$ and $V_{SS}$, so the first capacitors 56 maintain the voltage level of the first wires 60 above a first predetermined voltage level, and the second capacitors 58 maintain the voltage level of the second wires 62 below a second predetermined voltage level. Hence, the voltage gap between the first wires 60 and the second wires 62 is kept greater than a predetermined voltage value so that the stored data of the SRAM cells 10 will not be lost when the first switch units 64 and the second switch units 66 are turned off.

The total amount of the leakage currents of each SRAM cell 10 is proportional to the voltage gap between the two power terminals SAP and SAN. This means that the greater the voltage gap between the two power terminals SAP and SAN is, the greater the total amount of the leakage currents of each SRAM cell 10. However, during the period when the SRAM cells 10 are on standby and not accessed, because of slight leakage current of the SRAM cell 10, the voltage gap between the two power terminals SAP and SAN is pulled down to be less than $V_{DD}-V_{SS}$. Compared with the prior art, because the voltage gap between the two power terminals SAP and SAN is less than $V_{DD}-V_{SS}$, the amount of the leakage currents of the SRAM 30 is less than the amount of the leakage currents of the SRAM 1. Moreover, because the two power terminals SAP and SAN are electrically disconnected from $V_{DD}$ and $V_{SS}$ when the SRAM 30 is at the standby state, the SRAM 30 does not generate greater leakage current as in the prior art.

It is noted that the amount of leakage current of the SRAM cell 10 is reduced when the voltage gap between the two power terminals SAP and SAN is decreased. However, the slight leakage current of the SRAM cell 10 still makes the electric charge flow away slowly, pulling down the voltage level of the first wire 60, and pulling up the voltage level of the second wire 62. If the voltage level of the first wire 60 is less than a first predetermined voltage level, e.g. +1.0 volts, and the voltage level of the second wire 62 is greater than a second predetermined voltage level, e.g. +0.2 volts, that makes the voltage gap between the two power terminals SAP and SAN less than a predetermined voltage value, e.g. 0.8 volts, and the data stored in the SRAM cell 10 will be lost. Therefore, to avoid losing the stored data of the SRAM cell 10, the first capacitor 56 and the second capacitor 58 need to be recharged if the SRAM cell 10 is at the standby state too long. Please refer to FIG. 7, which is another timing diagram of the first control signal SETP and the second control signal SETN. When the SRAM cell 10 is at the standby state, the first control signal SETP is pulled down and the second control signal SETN is pulled up to turn on the first switch unit 64 and the second switch unit 66. When the first switch unit 64 and the second switch unit 66 are turned on, the first capacitor 56 and the second capacitor 58 are charged by VDD and $V_{SS}$ so that the voltage gap between the two power terminals SAP and SAN is increased. When the voltage gap between the two power terminals SAP and SAN is greater than the predetermined voltage value, the first control signal SETP is pulled up and the second control signal SETN is pulled down to turn off the first switch unit 64 and the second switch unit 66. In summary, the first capacitor 56 and the second capacitor 58 are charged appropriately, so the data stored in the SRAM cell 10 will not be lost until the power of the SRAM 30 is turned off.

Figure 8:
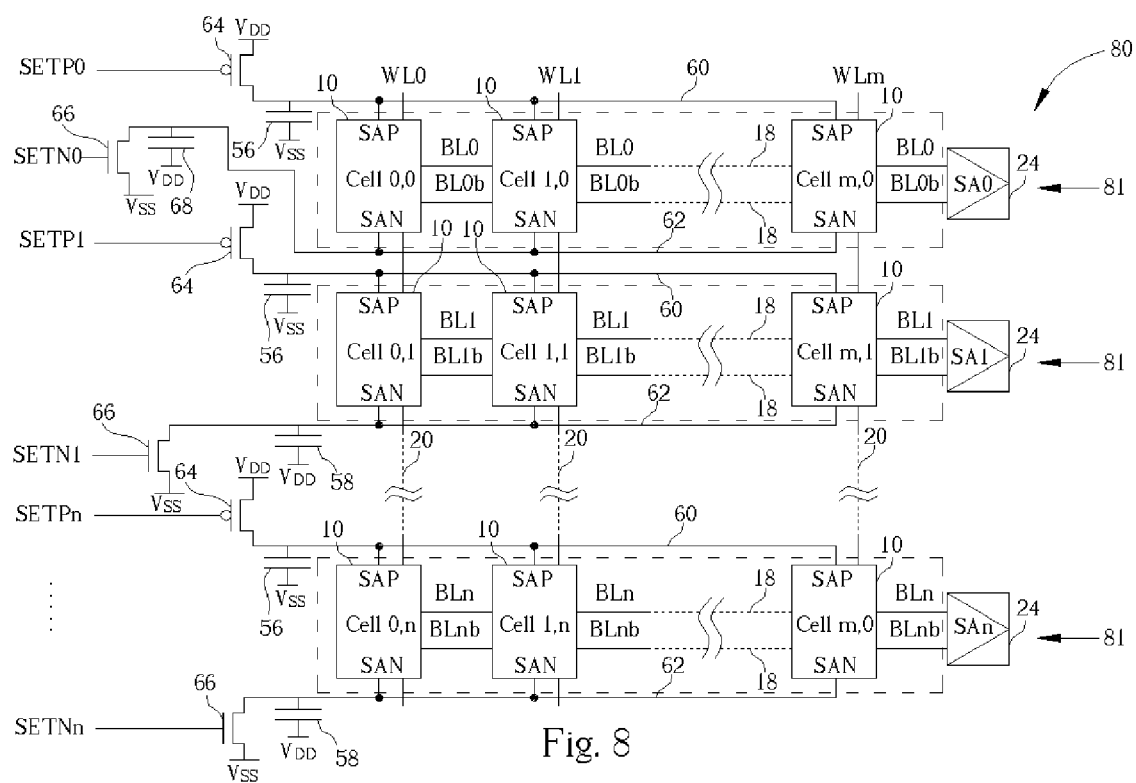
FIG. 8 is a schematic diagram of a static random access memory in accordance with another preferred embodiment of the present invention.
Figure 9:
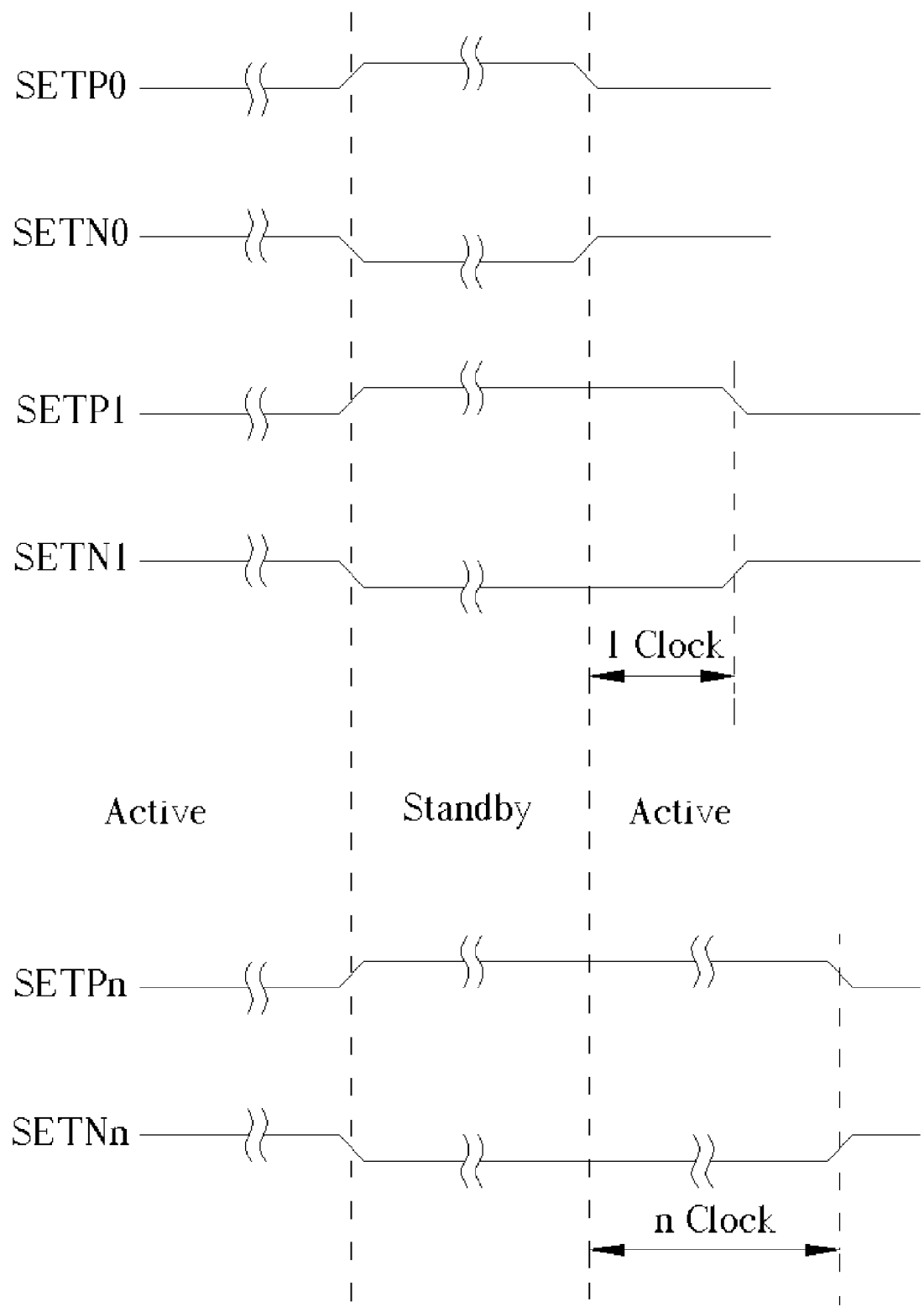
FIG. 9 is a timing diagram of the control signals shown in FIG. 8.

Please refer to FIGS. 8–9. FIG. 8 is a schematic diagram of a static random access memory 80 in accordance with another preferred embodiment of the present invention. FIG. 9 is a timing diagram of the control signals SETP0-SETPn and SETN0-SETNn shown in FIG. 8. The major difference between the SRAM 80 and the SRAM 30 is that the SRAM 80 has a plurality of the first switch units 64 and a plurality of the second switch units 66. The SRAM cells 10 at the same row are connected to the same first switch unit 64 and the same second switch unit 66. The SRAM cells 10 of the SRAM 80 are divided into a plurality of SRAM rows 81.

Each of the SRAM rows 81 has a plurality of the SRAM cells 10 which are connected to a corresponding first switch unit 64 and a corresponding second switch unit 66. Each of the first switch units 64 is controlled by a corresponding first control signal, and each of the second switch units 66 is controlled by a corresponding second control signal. For example, the first switch unit 64 and the second switch unit 66 of the most upper SRAM row 81 are respectively controlled by a first control signal SETP0 and a second control signal SETN0. The operations of each SRAM row 81 are the same as the operations of the SRAM 30. Take the most upper SRAM row 81 for example, when the SRAM cells 10 of the SRAM row 81 are accessed, the first control signal SETP0 is pulled down and the second control signal is pulled up to turn on the first switch unit 64 and the second switch unit 66. Therefore, $V_{DD}$ is applied to the first wire 60 of the SRAM row 81, and $V_{SS}$ is applied to the second wire 62 of the SRAM row 81 so that the first capacitor 56 and the second capacitor 58 are charged. When the SRAM row 81 is at the standby state, the first control signal SETP0 is pulled up and the second control signal SETN0 is pulled down so that the first switch unit 64 and the second switch unit 66 are turned off. Therefore, the first capacitor 56 maintains the voltage level of the first wire 60 and the first power terminal SAP greater than a first predetermined voltage level, e.g. +1.0 volts, and the second capacitor 58 maintains the voltage level of the second wire 62 and the second power terminal SAN less than a second predetermined voltage level, e.g. +0.2 volts. In this manner, when the SRAM cells 10 of the SRAM row 81 are not accessed, the data of the SRAM cells 10 will not be lost until the power of the SRAM 80 is turned off. Moreover, the amount of leakage current of the SRAM cells 10 is decreased because of the decrease of the voltage gap between the two power terminals SAP and SAN.

Figure 7:
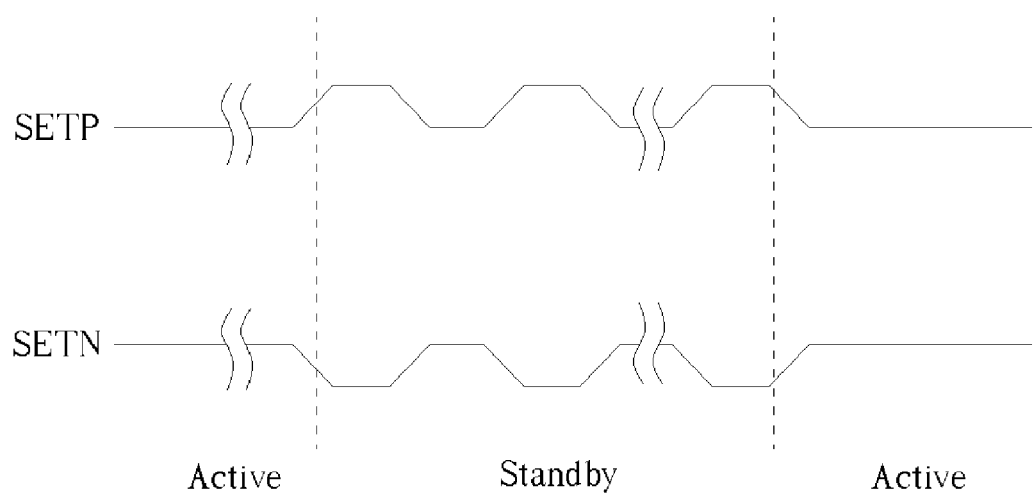
FIG. 7 is another timing diagram of the first control signal and the second control signal.

To save electric energy, the SRAM rows 81 of the SRAM 80 can be accessed sequentially. Please refer to FIG. 9. Every clock period, a first control signal SETPx is pulled down from high to low, and a second control signal SETNx is pulled up from low to high to turn on a corresponding first switch unit 64 and a corresponding second switch unit 66. Therefore, the first switch units 64 and the second switch units 66 are turned on sequentially to make the SRAM rows 81 accessible. Moreover, to avoid losing the data stored in the SRAM cells 10, the control signals SETP0–SETPn and SETN0–SETNn are pulled up or pulled down appropriately, similar to as shown in FIG. 7. The first capacitors 56 and the second capacitors 58, thus, are charged appropriately, and the voltage gap between the power terminals SAP and SAN is kept greater than a predetermined voltage level.

It is noted that the first capacitors 56 and the second capacitors 58 can be the intrinsic capacitances of the SRAM cells 10 respectively. Therefore, when the SRAM 30 or 80 is manufactured, it is not necessary to add extra capacitors to the SRAM. Moreover, the SRAM 30 and the SRAM 80 can operate normally with the first capacitors 56 but without the second capacitors 56, or with the second capacitors 58 but without the first capacitors 56. The voltage gap between the power terminals SAP and SAN can be maintained only by the first capacitors 56 or by the second capacitors 58. The data of the SRAM cells 10, thus, will not lost when the SRAM cells 10 are at the standby state.

In contrast to the SRAM structure of the prior art, the present invention discloses an SRAM having at least a first switch unit, at least a second switch unit, and at least a capacitor. During read/write operations of the SRAM, the first switch unit and the second switch unit are turned on so that two power terminals of the SRAM are electrically connected to $V_{DD}$ and $V_{SS}$, and that the capacitor is electrically connected between $V_{DD}$ and $V_{SS}$. Therefore, the capacitor is charged during the read/write operations of the SRAM. When the SRAM is at a standby state, the first switch unit and the second switch unit are turned off, and the capacitor maintains a voltage gap between the two power terminals greater than a predetermined voltage level. The data stored in the SRAM cells, thus, will not lost. Moreover, the voltage gap between the two power terminals of the SRAM cells is decreased when the SRAM is at the standby state, and leakage currents are decreased.

Those skilled in the art will readily observe that numerous modifications and alterations of the device may be made while retaining the teachings of the present invention. Accordingly, the above disclosure should be construed as limited only by the metes and bounds of the appended claims.

What is claimed is:

1. A static random access memory (SRAM) comprising:
   at least a first wire;
   at least a second wire;
   a plurality of word lines;
   a plurality of pairs of bit lines;
   a plurality of SRAM cells for storing data, each of the SRAM cells is connected to the first wire, the second wire, a corresponding word line, and a corresponding pair of the bit lines;
   a first bias terminal for inputting $V_{DD}$;
   a second bias terminal for inputting $V_{SS}$;
   at least a first capacitor connected to the first wire for maintaining a voltage level of the first wire above a first predetermined voltage level;
   at least a second capacitor connected to the second wire for maintaining a voltage level of the second wire below a second predetermined voltage level;
   at least a first switch unit connected between the first bias terminal and the first wire having a first control terminal for inputting a first control signal, wherein the first switch unit is turned on by the first control signal during read/write operations of the SRAM cells; and
   at least a second switch unit connected between the second bias terminal and the second wire having a second control terminal for inputting a second control signal, wherein the second switch unit is turned on by the second control signal during read/write operations of the SRAM cells.

2. The static random access memory of claim 1 wherein when the SRAM cells are not accessed, the first switch unit and the second switch unit are turned off so that two power terminals of each of the SRAM cells disconnect from $V_{DD}$ $V_{SS}$.

3. The static random access memory of claim 1 wherein when the SRAM cells are not accessed and the voltage level of the first wire approaches the first predetermined voltage level, the first switch unit is turned on so that the first capacitor is charged via $V_{DD}$ and that a difference between the voltage level of the first wire and the first predetermined voltage level is increased.

4. The static random access memory of claim 1 wherein when the SRAM cells are not accessed and the voltage level of the second wire approaches the second predetermined voltage level, the second switch unit is turned on so that the second capacitor is charged via $V_{SS}$ and that a difference between the voltage level of the second wire and the second predetermined voltage level is increased.

5. The static random access memory of claim 1 wherein the first control signal and the second control signal are conjugate to each other.

6. The static random access memory of claim 1 wherein the first capacitor and the second capacitor are intrinsic capacitances of the SRAM cells.

7. A static random access memory comprising:
   a first bias terminal for inputting $V_{DD}$;
   a second bias terminal for inputting $V_{SS}$;
   a plurality of word lines;
   a plurality of pairs of bit lines; and
   a plurality of SRAM rows, each of the SRAM rows comprising:
   a first wire;
   a second wire;
   a plurality of SRAM cells for storing data, each of the SRAM cells is connected to the first wire, the second wire, a corresponding word line, and a corresponding pair of the bit lines;
   a first capacitor connected to the first wire for maintaining a voltage level of the first wire above a first predetermined voltage level;
   a second capacitor connected to the second wire for maintaining a voltage level of the second wire below a second predetermined voltage level;
   a first switch unit connected between the first bias terminal and the first wire having a first control terminal for inputting a corresponding first control signal, wherein the first switch unit is turned on by the first control signal during read/write operations of the SRAM cells; and
   a second switch unit connected between the second bias terminal and the second wire having a second control terminal for inputting a corresponding second control signal, wherein the second switch unit is turned on by the second control signal during read/write operations of the SRAM cells.

8. The static random access memory of claim 7 wherein when the SRAM cells of each SRAM row are not accessed, the first switch unit and the second switch unit of the SRAM row are turned off so that two power terminals of each of the SRAM cells of the SRAM row disconnect from $V_{DD}$ and $V_{SS}$.

9. The static random access memory of claim 7 wherein when the SRAM cells of each SRAM row are not accessed and the voltage level of the first wire of the SRAM row approaches the first predetermined voltage level, the first switch unit of the SRAM row is turned on so that the first capacitor of the SRAM row is charged via $V_{DD}$ and that a difference between the first predetermined voltage level and the voltage level of the first wire of the SRAM row is increased.

10. The static random access memory of claim 7 wherein when the SRAM cells of each SRAM row are not accessed and the voltage level of the second wire of the SRAM row approaches the second predetermined voltage level, the second switch unit of the SRAM row is turned on so that the second capacitor of the SRAM row is charged via $V_{SS}$ and that a difference between the second predetermined voltage level and the voltage level of the second wire of the SRAM row is increased.

11. The static random access memory of claim 7 wherein the first control signals and the second control signals are conjugate to each other.

12. The static random access memory of claim 7 wherein the first capacitors and the second capacitors are intrinsic capacitances of the SRAM cells.

13. The static random access memory of claim 7 wherein the first switch units and the second switch units are turned on sequentially.

14. A static random access memory comprising:
a plurality of SRAM cells for storing data;
at least a first switch unit;
at least a second switch unit; and
at least a capacitor;
wherein during read/write operations of the SRAM cells, the first switch unit and the second switch unit are turned on so that two power terminals of each SRAM cells are electrically connected to $V_{DD}$ $V_{SS}$ respectively and that the capacitor is electrically connected between $V_{DD}$ $V_{SS}$, and when the SRAM cells are not accessed, the first switch unit and the second switch unit are turned off so that the two power terminals of each SRAM cell electrically disconnected from $V_{DD}$ $V_{SS}$ the capacitor maintains a voltage gap between the two power terminals greater than a predetermined voltage value.

15. The static random access memory of claim 14 wherein the first switch unit is connected to $V_{DD}$, the first switch unit is connected to $V_{SS}$, one of two terminals of the capacitor is connected to the first switch unit, and the other terminal of the two terminals of the capacitor is connected to $V_{SS}$.

16. The static random access memory of claim 14 wherein the first switch unit is connected to $V_{DD}$, the first switch unit is connected to $V_{SS}$, one of two terminals of the capacitor is connected to the second switch unit, and the other terminal of the two terminals of the capacitor is connected to $V_{DD}$.

17. The static random access memory of claim 1 wherein the capacitor is an intrinsic capacitance of the SRAM cells.

* * * * *